United States Patent [19]
Sedlak et al.

[11] Patent Number: 6,052,306
[45] Date of Patent: Apr. 18, 2000

[54] METHOD AND DEVICE FOR AUTOMATIC DETERMINATION OF THE REQUIRED HIGH VOLTAGE FOR PROGRAMMING/ ERASING AN EEPROM

[75] Inventors: Holger Sedlak; Hans-Heinrich Viehmann, both of Munich, Germany

[73] Assignee: Siemens Aktiengesellschaft, Munich, Germany

[21] Appl. No.: 09/068,430

[22] PCT Filed: Nov. 4, 1996

[86] PCT No.: PCT/DE96/02099

§ 371 Date: May 8, 1998

§ 102(e) Date: May 8, 1998

[87] PCT Pub. No.: WO97/17704

PCT Pub. Date: May 15, 1997

[51] Int. Cl.[7] .................................................. G11C 16/04
[52] U.S. Cl. ................................. 365/185.19; 365/185.18; 365/185.22; 365/185.29
[58] Field of Search ........................ 365/185.19, 185.18, 365/185.22, 185.29

[56] References Cited

U.S. PATENT DOCUMENTS

| | | | |
|---|---|---|---|
| 5,508,958 | 4/1996 | Fazio et al. | 365/185.19 |
| 5,544,117 | 8/1996 | Nakayama et al. | 365/185.22 |
| 5,883,833 | 3/1999 | Naura et al. | 365/185.19 |
| 5,909,390 | 6/1999 | Harari | 365/185.19 |

FOREIGN PATENT DOCUMENTS

| | | |
|---|---|---|
| 0 708 450 A2 | 4/1996 | European Pat. Off. . |
| WO95/07536 | 3/1995 | WIPO . |

OTHER PUBLICATIONS

Patents Abstracts of Japan.

*Primary Examiner*—Son T. Dinh
*Attorney, Agent, or Firm*—Hill & Simpson

[57] ABSTRACT

A method for automatically determining the high voltage required for programming/erasing an EEPROM wherein the high voltage which is required for erasing or programming each electrically erasable and programmable read-only semiconductor memory is determined individually for each such memory and is stored in the memory itself. This determined high voltage can be called up from the the memory for every further erase or programming operation. Starting from a first value of the high voltage for programming or erasing the memory and a first value of a read voltage for checking the programming or erase operation, the most favorable high voltage is determined by progressively changing either the high voltage or the read voltage.

5 Claims, 3 Drawing Sheets

METHOD AND DEVICE FOR AUTOMATIC DETERMINATION OF THE REQUIRED HIGH VOLTAGE FOR PROGRAMMING/ ERASING AN EEPROM

FIELD OF THE INVENTION

The present invention relates to a method by which, in an electrically erasable and programmable read-only semiconductor memory, unambiguous programming and unambiguous erasure are possible and are largely independent of technology-dictated fluctuations in the dependence of the threshold voltage on the high voltage.

DESCRIPTION OF THE PRIOR ART

In the case of MOS field-effect transistors, doping regions are present in a substrate on both sides of a gate electrode which is arranged in an insulated manner over the substrate. Such doping regions are referred to as source and drain regions. By applying a voltage between the gate electrode and the substrate, in the case of an enhancement-mode field-effect transistor, for example, charge carriers from the substrate are concentrated under the gate electrode. By applying a voltage between the drain region and the source region, further charge carriers from the source region are injected into this enhanced region. A conductive channel is thereby formed under the gate electrode between the source region and the drain region wherein the conductivity of the channel can be controlled by the voltage across the gate electrode.

However, in order to form a conductive channel, a voltage must be applied between the gate electrode and the substrate, the voltage also must have a specific, technology-dependent minimum value, which is referred to as the threshold voltage.

In principle, electrically erasable read-only memory cells of the EEPROM or flash type have the same structure as MOS field-effect transistors, but they also have a further electrode which is completely surrounded by non-conductive material—that is to say is completely insulated. This additional electrode is referred to as a floating gate, between their gate electrode, or control electrode, and the substrate. The threshold voltage of the transistor forming a memory cell can be altered by applying a charge to this floating gate.

The application of charges to the floating gate is referred to as programming and the removal of the charges is referred to as erasure of the memory cell. Normally, the effect of programming is to shift the threshold voltage towards lower values wherein the transistor forming the cell is usually in the on state even without the application of a voltage to the control electrode.

In order to ascertain whether or not a cell is programmed, that is whether a logic "1" or "0" has been written to it, a voltage read voltage, is applied to the control electrode. This voltage lies approximately between the threshold voltages of a programmed cell and of an erased cell. The logic state of the cell can be ascertained depending on whether a current flows through the cell.

An EEPROM or flash cell is programmed or erased by a tunnelling current flowing from the substrate to the floating gate or vice versa. For this purpose, sufficient energy must be supplied to the charge carriers, which is done by applying a high voltage of approximately 15 V between the control electrode and the substrate and by forming an extremely thin insulating layer between the floating gate and the substrate. As result, a very high field strength occurs there.

To programme an n-channel transistor, positive charge carriers are applied to the floating gate which means when using a conventional positive high voltage, that the latter must be applied to the drain region while 0 V are applied to the control electrode. Correspondingly, in order to erase the cell, the high voltage is then applied to the control electrode and 0 V is applied to the drain region. This then removes the charge carriers again from the floating gate.

A specific minimum high voltage is fundamentally necessary in order to allow the tunnelling current to begin. However, the degree of programming or erasure also depends on the actual level of the high voltage and on the period of time during which it is applied. The fundamental profile of the threshold voltage Uth, and hence of the charge state of the floating gate, as a function of the level of the high voltage Vpp is illustrated with solid lines in FIG. 4. It can be seen that as the high voltage increases, the threshold voltage of the cell rises during erasure and falls during programming. In an ideal cell, the characteristics run symmetrically with respect to one another, with the result that the threshold voltage at the point of intersection of the two characteristics is selected as the read voltage UL. At this point there is the same margin from the two threshold voltages and thus also the same signal-to-noise ratio.

For the selection of the level of the high voltage, there is, on the one hand, the desire for a maximum signal-to-noise ratio and for all of the cells to be unambiguously programmed or erased. This means a large high voltage. On the other hand, the outlay for the high-voltage generator, which is usually formed by a charge pump, is to be kept to a minimum, which means that the high voltage is kept to a minimum. The value normally selected for the high voltage is therefore one which just permits unambiguous programming or erasure.

However, on account of technology-dictated manufacturing tolerances, differences in the profiles of the characteristics, which show the dependence of the threshold voltage Uth on the high voltage Vpp during programming and erasure, can occur from wafer to wafer, from chip to chip on a wafer and from cell to cell on a chip. This can lead to defective memories. FIG. 4 uses dashed lines to illustrate a further programming characteristic and a further erasure characteristic of the kind that may be produced as a result of such fluctuations. As is evident, a detectable erase operation would not take place in a cell having the dashed profile of the characteristics for a given read voltage UL and a high voltage of the kind determined as favourable from the solid characteristics.

The object of the present invention, therefore, is to specify a method and an apparatus by means of which, in an electrically erasable and programmable read-only semiconductor memory, unambiguous programming and unambiguous erasure are possible and are largely independent of technology-dictated fluctuations in the dependence of the threshold voltage on the high voltage.

An object is achieved by means of methods in accordance with claims 1 and 3 as well as an apparatus in accordance with claim 5.

SUMMARY OF THE INVENTION

In accordance with the teachings of the present invention high voltage which is most favorable for each memory is progressively determined for each memory and stored in a non-volatile manner in a read-only memory so that it can be read out and used by the control unit for all of the programming and erase operations.

Provisions may be made for the high voltage to be determined and stored only when the memory is turned on for the very first time, but it is also possible to design the control unit in such a way that this operation is effected for every turn-on. In certain cases, for example in a greatly changing environment, it may also be advantageous to carry out a determination of the most favorable high voltage at regular intervals.

Progressive determination in this case means that the high voltage to be applied to the memory for the purpose of programming or erasure is changed in steps between a minimum value and a maximum value and the programming or erasure result is tested using a fixed, predetermined read voltage. Progressive determination also means that the programming or erasure is carried out at a predetermined high voltage, which likewise lies between the minimum value and the maximum value, advantageously forming the arithmetic mean of these two values, and is tested using different read voltages.

The value taken for the minimum value of the high voltage is advantageously one which is greater than or equal to that which is physically necessary to be able to bring about the tunnelling effect. As a result, time-consuming attempts at programming and erasure which cannot fundamentally lead to success anyway are not undertaken. The maximum value in limited by the circuitry of the charge pump for generating the high voltage.

In the first case, where the read voltage remains constant, the latter can have the same value as for every "normal" instance of reading from the memory during operation as prescribed. However, it can also be advantageously set more critically, i.e., closer to the threshold voltage set by the programming or erase operation, in order to be able to detect defective cells more accurately.

In order to determine the required high voltage in a method according to the present invention, it is necessary to accept a plurality of erase or programming operations, wherein it is possible to carry out a programming or erase operation prior to each erase or programming operation with the maximum high voltage set by the control unit. However, this requires a considerable length of time.

In an alternative embodiment, the method is significantly faster, since just one programming or erase operation is carried out, while a plurality of read operations are effected. The latter, however, proceeds much more rapidly.

In a development of the present invention, the required high voltage that is determined can still be increased by a fixed predetermined value in order to ensure a highly reliable programming and erase operation.

Additional features and advantages of the present invention are described in, and will be apparent from, the Detailed Description of the Preferred Embodiments and from the Drawings.

DETAILED DESCRIPTION OF THE PREFERRED EMBODIMENTS

Figure 1:
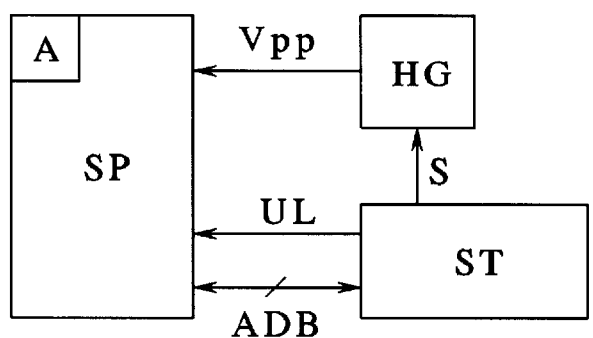
FIG. 1 shows a basic circuit diagram of an apparatus which may practice the method of the present invention.

FIG. 1 shows an electrically programmable and erasable read-only semiconductor memory SP, which can be addressed by a control unit ST via an address and data bus ADB. A read voltage UL can be applied to the memory SP by the control unit ST via an additional line. The programming or erasure of data in the read-only memory SP requires a high voltage Vpp, which is generated by an adjustable high-voltage generator HG and is applied to the memory SP. The high-voltage generator HG is driven by a signal S from the control unit ST. The signal S, which can be in both analog and digital form, defines the value of the high voltage Vpp.

A specific value of the high voltage Vpp is required for the reliable programming or erasure of the memory cells of the memory SP. However, because of technology-dictated fluctuations in the properties of the memory cells, this value can vary from semiconductor chip to semiconductor chip and thus from memory to memory. Although the high-voltage generator HG could be set in such a way that it supplies a maximum high voltage, with the result that all of the memories SP can be reliably programmed and erased, this would lead to an unnecessarily high power consumption in most of the semiconductor chips on which memories SP are implemented, since many of the memories SP could be operated with a lower high voltage Vpp.

Pursuant to a method of the present invention, therefore, the most favorable value of the high voltage Vpp, that is to say the value at which reliable programming and reliable erasure of the memory SP is possible, is determined individually for each memory and is stored in an area A in the memory SP. As a result, it can be called up from the area A by the control unit ST for each further programming and erase operation.

Although the control unit ST can, in principle, be hardwired in order to carry out the method of the present invention, it is advantageously formed by a microprocessor with an associated program memory.

In accordance with the teachings of the invention, the control unit ST sets the adjustable high-voltage generator HG by means of the signal S such that the generator applies a first value of the high voltage Vpp to the memory SP. In order to program the memory cells of the memory SP, the high voltage Vpp is applied to the drain connections of the memory cells, while the control gate connection receives 0 volts. Conversely in order to erase the memory cells, the high voltage Vpp is applied to the control gate connection of the memory cells and the drain connection receives 0 volts. The first value of the high voltage Vpp will, in this example, be the minimum value and then be progressively increased. However, it is equally possible to start at the maximum value of the high voltage Vpp and then progressively reduce this value. The high voltage Vpp is fundamentally applied to the memory cells for a length of time sufficient to ensure reliable programming or reliable erasure given a suitable magnitude of the high voltage Vpp.

After this first erase or programming operation, the cells are read by the control unit ST with the read voltage UL which is customary in the case of normal operation. However, it is also possible, in principle, to select a more critical read voltage, that is to say a read voltage which is closer to the threshold voltages of programmed or erased memory cells.

The values read are then compared with the previously written values, that is to say programmed values in the case of a logic "1" or erased values in the case of a logic "0". If the comparison reveals that the read values correspond to the values desired for writing, the first value of the high voltage Vpp is stored in an area of the memory SP so that it can be called up by the control unit ST for all further programming and erase operations. Prior to storage, the first value of the high voltage Vpp can still be increased by a safety margin.

If the comparison of the read values with the values desired for writing is negative, the value of the high voltage Vpp is increased by a specific amount, under the control of the control unit ST by means of the signal S, to a second value. As a result, the memory cells of the memory SP are programmed or erased.

The read values are subsequently compared again with the values desired for writing and, in the event of a positive comparison, the now second value of the high voltage Vpp, possibly increased by a safety margin, is stored in the memory SP. If the comparison once again turns out to be negative, then the high voltage Vpp is again increased by an amount. This method continues until either all of the cells are identified as having been erased or programmed or the high voltage Vpp cannot be increased any further and the memory SP is identified as being defective.

In an advantageous development of this method, it is possible, before every increase in the high voltage Vpp, for all of the cells to be programmed with the maximum high voltage in the case of the erasure of the memory SP and, in the same way, for all of the cells to be erased with the maximum high voltage in the case of the programming of the memory SP. This ensures that the same conditions prevail before every application of a new value of the high voltage Vpp.

Figure 2:
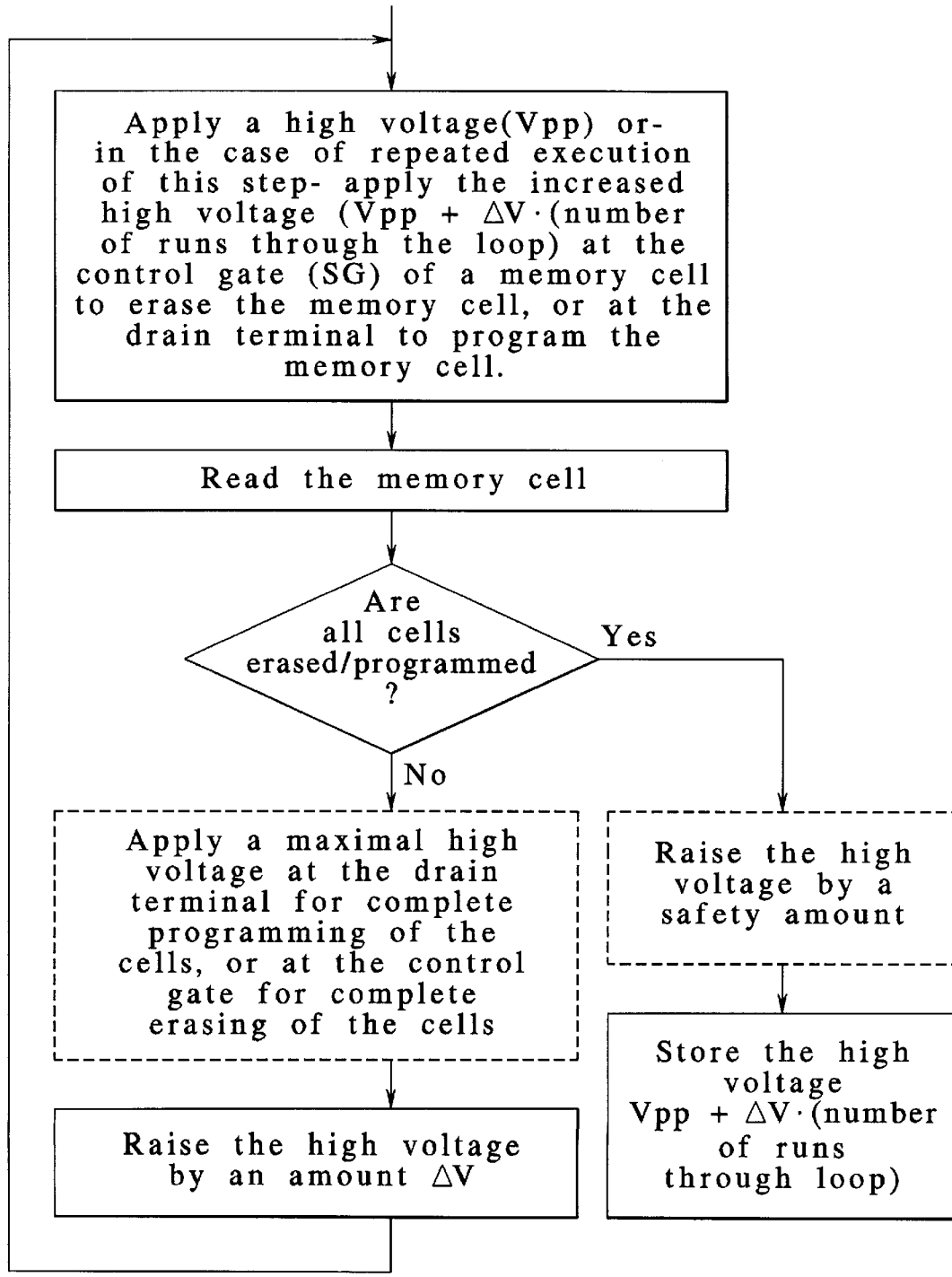
FIG. 2 shows a flow diagram of a method according to the present invention.

The sequence of this first method according to the present invention is illustrated as a flow diagram in FIG. 2. Optional method steps, which relate to advantageous developments, are framed by dashed lines.

Figure 3:
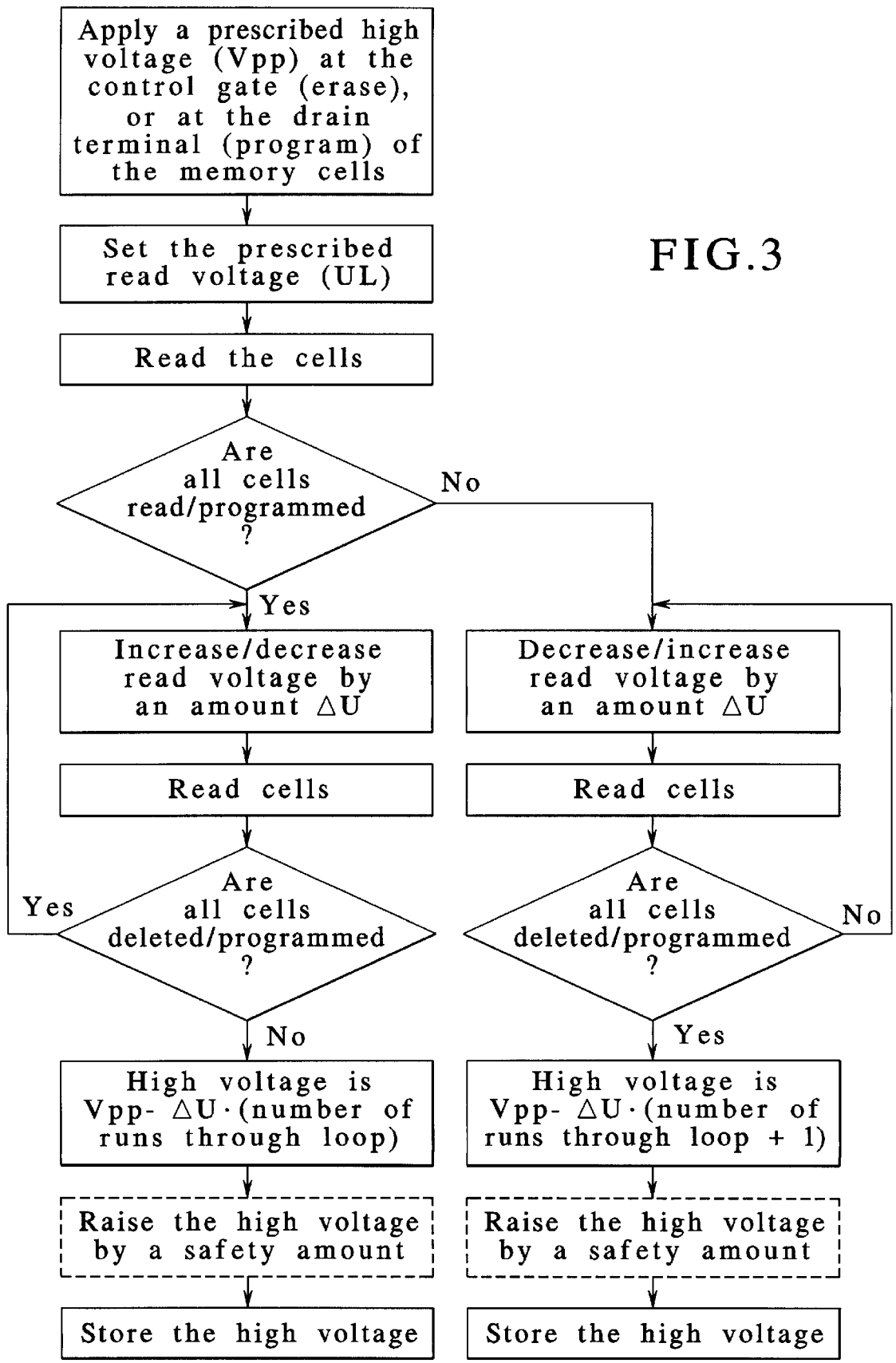
FIG. 3 shows a flow diagram of another method according to the present invention.

In the same way, FIG. 3 illustrates the flow diagram of another method of the present invention. In this case, too, a high voltage Vpp is initially applied to the control gate for the purpose of erasing the memory cells of the memory SP and to the drain connection for the purpose of programing the memory cells of the memory SP. However, the value of the high voltage Vpp is, in this case, fixedly predetermined and is advantageously calculated as the arithmetic mean of the minimum and maximum values of the high-voltage generator HG that can be set.

After this, a predetermined read voltage UL is set by the control unit ST and cells are then read by means of the read voltage. A test is subsequently made to see whether the cells are erased or programmed at this predetermined read voltage.

Figure 4:
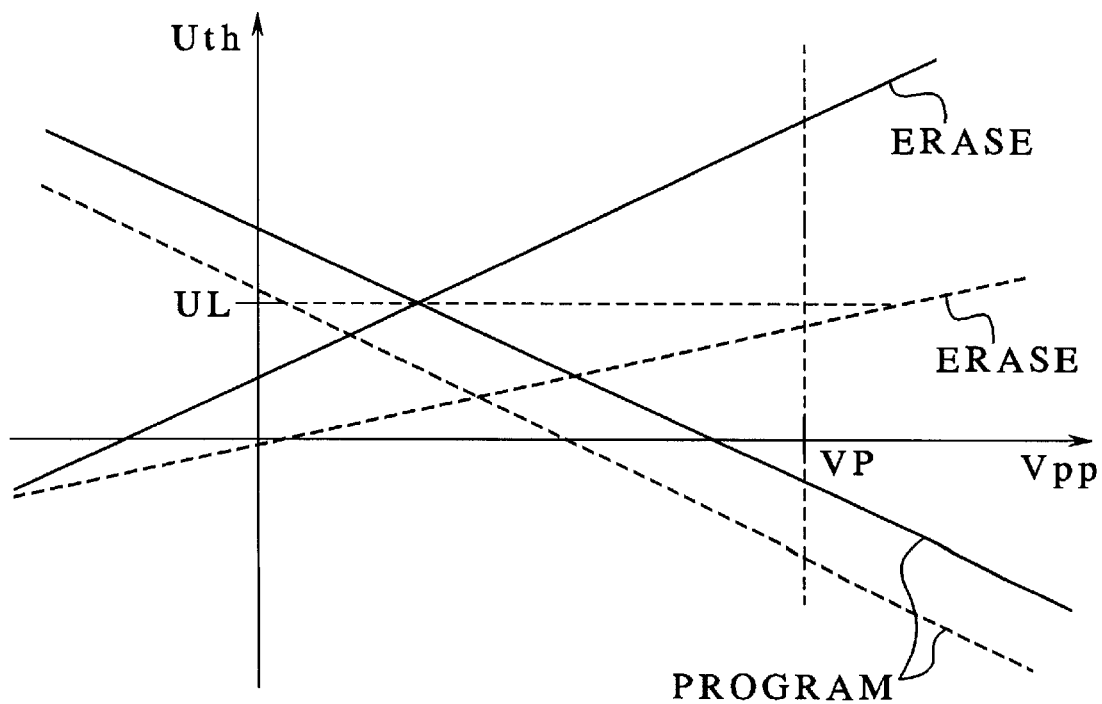
FIG. 4 shows, in graphical form, characteristics which illustrate the dependence of threshold voltage on high voltage during the erasure and programming of an electrically erasable and programmable non-volatile memory cell.

This method is based on the insight that the issue of reliable programming and erasure of an electrically programmed and erasable read-only memory cell at a given high voltage Vpp, which must, of course, be at least large enough for charges to pass to the floating gate of the memory cell in the first place, also depends on the situation of the read voltage UL. This is illustrated in FIG. 4. An ideal profile of the characteristics, which show the dependence of the threshold voltage Uth of a memory cell during erasure and programming on the high voltage Vpp, is illustrated with a solid line. In terms of magnitude, the two characteristics have the same gradient wherein the ideal read voltage UL results at the point of intersection of the two characteristics. At a given value VP of the high voltage Vpp, the margin between the threshold voltages Uth and the read voltage UL can be seen in FIG. 4.

FIG. 4 uses dashed lines to show a non-ideal position of the characteristics which is caused by technology-dictated fluctuations. As can be seen, although a programmed cell would be identified at the previously ideal read voltage UL, an erased cell would likewise be detected as being programmed. However, if a memory cell having the characteristic illustrated by dashed lines were read with a read voltage of about 0 volts, then it would be reliably identified as being erased or programmed.

On the basis of this insight, in a further method of the present invention, the read voltage UL is increased or reduced by an amount $\Delta U$, depending on whether erasure or programming has been effected. After this, a test is again carried out to see whether all of the cells are erased or programmed. If this is not the case, the predetermined high voltage Vpp already had the correct value at the first predetermined "normal" read voltage UL and this value is stored in the memory SP, possibly after having been increased by a safety margin.

However, if all of the memory cells have again been identified as being erased or programmed, the read voltage is once again increased or reduced (depending on whether erasure or programming has been effected) by an amount $\Delta U$ and the value of the cells is once again read and compared with the value desired for writing. If it now emerges that not all of the cells are erased or programmed, the predetermined high voltage is reduced by the amount $\Delta U$ by which the read voltage was increased or reduced and this value is stored in the memory SP, possibly after having been increased by a safety margin.

The read voltage UL is increased or reduced by an amount $\Delta U$ as often as until the test reveals that at least one memory cell has not been erased or programmed. The predetermined high voltage is then reduced by a value which corresponds to the product of the amount $\Delta U$ and the number of complete loop iterations.

In the event that in the very first test at least one cell has been identified as not being erased or programmed, the read voltage is reduced or increased by an amount $\Delta U$, depending on whether erasure or programming has been effected. The read voltage UL is therefore changed in the other direction. This is followed, possibly over a plurality of loop iterations, by testing and progressive reduction or increasing of the read voltage UL by the amount $\Delta U$ until all of the cells are identified as being erased or programmed. The predetermined high voltage is then increased by a value which corresponds to the product of the amount $\Delta U$ and the number of loop iterations+1. This value is then stored, possibly after having been increased by a safety margin in the area A of the memory SP.

In the methods of the present invention, different values of the high voltage can be stored in the memory SP for erasure and programming. However, it is also possible to select just one value namely the larger of the two values. The methods of the invention enable the high voltage Vpp, which is required for erasing or programming each electrically erasable and programmable read-only semiconductor memory SP to be determined individually for each electrically erasable and programmable read-only semiconductor memory SP and to be stored in the memory SP itself, in an area A provided there. This determined high voltage can be called up from the area A for every further erase or programming operation. The methods according to the invention proceed automatically, at least during the first start-up of the memory SP.

What is claimed is:

1. Method for determining the high voltage (Vpp) which is required for programming or for erasure in a programmable and erasable read-only semiconductor memory (SP), having the following steps:
   a) application of a high voltage (Vpp) or—in the case of the repeated implementation of this step—the increased high voltage (Vpp+ΔV• (number of loop iterations)) to the control gate (SG) of a memory cell for the purpose of erasing the memory cell or to the drain connection of the memory cell for the purpose of programming the memory cell,
   b) reading of the cells with a predetermined read voltage (UL),
   c) if all of the cells are erased or programmed: non-volatile storage of the high voltage (Vpp+ΔV• (number of loop iterations)),
   d) if at least one cell is not erased or programmed: increasing of the high voltage by a specific amount (ΔV) and beginning at step a).

2. Method according to claim 1, characterized in that the memory is erased or programmed with a maximum high voltage before every instance of programming or erasing the memory cells with a set high voltage (Vpp+ΔU• (number of loop iterations)).

3. Method for determining the high voltage (Vpp) which is required for programming or for erasure in a programmable and erasable read-only semiconductor memory (SP), having the following steps:
   a) application of a predetermined high voltage (Vpp) to the control gate of a memory cell for the purpose of erasing the memory cell or to the drain connection of the memory cell for the purpose of programming the memory cell,
   b) setting of a predetermined read voltage (UL),
   c) reading of the cells at the predetermined read voltage (UL),
   d) if all of the cells are erased or programmed:
      d1) increasing or reduction of the read voltage by a predetermined amount (ΔU),
      d2) reading of the cells at the increased or reduced read voltage,
      d3) if at least one cell is not erased or programmed: reduction of the predetermined high voltage (Vpp) by the amount ΔU• (number of loop iterations) and storage of the reduced high voltage (Vpp−ΔU• (number of loop iterations)),
      d4) if all of the cells are erased or programmed: continuation with step d1),
   e) if at least one cell is not erased or programmed:
      e1) reduction or increasing of the read voltage by a predetermined amount (ΔU),
      e2) reading of the cells at the reduced or increased read voltage,
      e3) if all of the cells are erased or programmed: increasing of the predetermined high voltage (Vpp) by the amount ΔU• (number of loop iterations+1) and storage of the increased high voltage (Vpp+ΔU• (number of loop iterations+1)),
      e4) if at least one cell is not erased or programmed: continuation with step e1).

4. Method according to claim 1, 2 or 3, characterized in that the high voltage is increased by a safety margin before it is stored.

5. Apparatus for automatically determining the high voltage(s) (Vpp) which is/are required for programming and/or erasure in a programmable and erasable read-only semiconductor memory (SP), which apparatus is operated using a method in accordance with one of claims 1 to 4,
   having a control unit (ST), which is connected to the memory (SP) via an address and data bus (ADB) and also to a line for applying a read voltage (UL) to the memory (SP),
   having an adjustable high-voltage generator (HG), to which a control signal (S) can be applied by the control unit (ST),
   it being possible for an adjustable high voltage (Vpp) to be applied to the memory (SP) by the high-voltage generator (HG), and
   the memory (SP) having an area (A) to and from which the determined high voltage(s) (Vpp) required can be written and read.

* * * * *